(12) United States Patent
Teeter et al.

(10) Patent No.: US 10,291,191 B2
(45) Date of Patent: May 14, 2019

(54) LOW LEAKAGE PROTECTION CIRCUIT FOR RF POWER AMPLIFIER

(71) Applicant: Qorvo US, Inc., Greensboro, NC (US)

(72) Inventors: Douglas Andrew Teeter, Lexington, MA (US); Nick Marcoux, Maynard, MA (US); Ming Ji, Melrose, MA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/804,595

(22) Filed: Nov. 6, 2017

(65) Prior Publication Data

US 2018/0131334 A1    May 10, 2018

Related U.S. Application Data

(60) Provisional application No. 62/417,425, filed on Nov. 4, 2016.

(51) Int. Cl.
| | |
|---|---|
| *H03F 3/21* | (2006.01) |
| *H03F 3/193* | (2006.01) |
| *H03F 1/52* | (2006.01) |
| *H04B 1/04* | (2006.01) |
| *H03F 3/24* | (2006.01) |
| *H04B 1/16* | (2006.01) |

(52) U.S. Cl.
CPC ............ *H03F 3/21* (2013.01); *H03F 1/523* (2013.01); *H03F 3/193* (2013.01); *H03F 3/245* (2013.01); *H04B 1/0466* (2013.01); *H04B 1/1607* (2013.01); *H03F 2200/426* (2013.01); *H03F 2200/451* (2013.01); *H04B 2001/0408* (2013.01)

(58) Field of Classification Search
USPC ................................. 330/285, 289, 296–298
See application file for complete search history.

(56) References Cited

U.S. PATENT DOCUMENTS

| | | |
|---|---|---|
| 6,525,611 B1 | 2/2003 | Dening et al. |
| 6,990,323 B2 | 1/2006 | Prikhodko et al. |
| 7,268,990 B1 | 9/2007 | Loeb et al. |

(Continued)

OTHER PUBLICATIONS

Järvinen, Esko et al., "Bias Circuits for GaAs HBT Power Amplifiers," IEEE MTT-S International Microwave Symposium Digest, May 20-24, 2001, Phoenix, AZ, USA, IEEE, 4 pages.

(Continued)

*Primary Examiner* — Hieu P Nguyen
(74) *Attorney, Agent, or Firm* — Withrow & Terranova, P.L.L.C.

(57) ABSTRACT

The present disclosure relates to a radio frequency (RF) communications system including an RF power amplifier (PA), a bias circuit, and a protection circuit. The RF PA has an amplifier control terminal and a power supply terminal, the bias circuit is coupled to the amplifier control terminal, and the protection circuit is coupled between the bias circuit and the power supply terminal. Herein, the protection circuit is configured to reduce a current through the power supply terminal using the bias circuit via the amplifier control terminal when the RF PA is in an operation mode and a magnitude of a voltage at the power supply terminal exceeds a protection threshold. Further, the protection circuit is configured to be open and does not allow a current to pass through when the RF PA is in a standby mode.

21 Claims, 11 Drawing Sheets

(56) References Cited

U.S. PATENT DOCUMENTS

| | | |
|---|---|---|
| 7,876,157 B1 * | 1/2011 | Kang .................. H03F 1/0261 330/285 |
| 9,306,514 B2 | 4/2016 | Kwon et al. |
| 9,705,452 B2 | 7/2017 | Oh et al. |
| 2017/0047901 A1 | 2/2017 | Kim et al. |

OTHER PUBLICATIONS

Karoui, Walid et al., "A protection circuit for HBT RF power amplifier under load mismatch conditions," Joint 6th International IEEE Northeast Workshop on Circuits and Systems and TAISA Conference (NEWCAS-TAISA), Jun. 22-25, 2008, Montreal, QC, Canada, IEEE, pp. 241-244.

Noh, Y.S. et al., "Linearized InGaP/GaAs HBT MMIC Power Amplifier with Active Bias Circuit," IEEE Radio and Wireless Conference, Aug. 19-22, 2001, Waltham, MA, USA, IEEE, pp. 249-252.

Zimmermann, Niklas et al., "An Over-Voltage Protection Circuit for CMOS Power Amplifiers," IEEE International Conference on Electronics, Circuits and Systems, Aug. 31-Sep. 3, 2008, St. Julien's, Malta, IEEE, pp. 161-164.

Non-Final Office Action for U.S. Appl. No. 15/644,098, dated May 3, 2018, 11 pages.

\* cited by examiner

LOW LEAKAGE PROTECTION CIRCUIT FOR RF POWER AMPLIFIER

RELATED APPLICATIONS

This application claims the benefit of provisional patent application Ser. No. 62/417,425, filed Nov. 4, 2016, the disclosure of which is hereby incorporated herein by reference in its entirety.

FIELD OF THE DISCLOSURE

The present disclosure relates to a radio frequency (RF) communications system, and more particularly to an RF communications system having an RF power amplifier (PA) and a low leakage protection circuit for the RF PA.

BACKGROUND

Radio frequency (RF) power amplifiers (PAs) are widely used in RF communications systems to amplify RF transmit signals or other RF signals. As such, RF PAs may be coupled to RF antennas or other interface circuitry. In this regard, an RF PA may be subjected to extreme conditions, such as a high direct current (DC) supply voltage, a high RF input power, a high voltage standing wave ratio (VSWR), the like, or any combination thereof. Such extreme conditions may damage or degrade the RF PA. Therefore, there is a need for an RF PA protection circuit that helps protect the RF PA from damaging effects of extreme conditions. Further, there is also a need to eliminate or minimize the current leakage of the RF PA protection circuit in the extreme conditions.

SUMMARY

The present disclosure relates to a radio frequency (RF) communications system including an RF power amplifier (PA), a bias circuit, and a protection circuit. The RF PA has an amplifier control terminal, a power supply terminal, and an RF input terminal. The bias circuit is coupled to the amplifier control terminal, and the protection circuit is coupled between the bias circuit and the power supply terminal. Herein, the protection circuit is configured to reduce a current through the power supply terminal using the bias circuit via the amplifier control terminal when the RF PA is in an operation mode and a magnitude of a voltage at the power supply terminal exceeds a protection threshold. Further, the protection circuit is configured to be open and does not allow a current to pass through when the RF PA is in a standby mode.

In one embodiment of the RF communications system, the bias circuit is configured to bias the RF PA via the amplifier control terminal when the RF PA is in the operation mode and the magnitude of the voltage at the power supply terminal does not exceed the protection threshold.

In one embodiment of the RF communications system, the RF PA is configured to receive an RF input signal via the RF input terminal and provide an RF output signal via the power supply terminal.

In one embodiment of the RF communications system, the RF PA includes at least one PA transistor, at least one ballast resistor, and at least one input capacitor, wherein the at least one ballast resistor coupled between the at least one PA transistor and the amplifier control terminal, and the at least one input capacitor is coupled between the at least one PA transistor and the RF input terminal.

In one embodiment of the RF communications system, the at least one PA transistor is a bipolar junction transistor (BJT) or a field-effect transistor (FET).

In one embodiment of the RF communications system, the RF PA comprises a number of PA transistors coupled in parallel, such that the number of PA transistors includes the at least one PA transistor.

In one embodiment of the RF communications system, the RF PA is configured to amplify the RF input signal using a power supply signal having a power supply voltage, such that when the power supply voltage exceeds a power supply voltage threshold, the magnitude of the voltage at the power supply terminal exceeds the protection threshold.

In one embodiment of the RF communications system, when a magnitude of the RF input signal exceeds an RF input signal threshold, the magnitude of the voltage at the power supply terminal exceeds the protection threshold.

In one embodiment of the RF communications system, when a magnitude of a voltage standing wave ratio (VSWR) at the power supply terminal exceeds a VSWR threshold, the magnitude of the voltage at the power supply terminal exceeds the protection threshold.

In one embodiment of the RF communications system, the protection circuit includes a level shift circuit, an interface circuit, and a switch circuit. Herein, the level shift circuit is coupled between the power supply terminal and the interface circuit. The interface circuit is coupled between the bias circuit and the level shift circuit. The switch circuit is in series with the level shift circuit and the interface circuit. When the RF PA is in the operation mode, the switch circuit is configured to close the protection circuit, and when the RF PA is in the standby mode, the switch circuit is configured to open the protection circuit.

In one embodiment of the RF communications system, the switch circuit is coupled between the level shift circuit and the interface circuit.

In one embodiment of the RF communications system, the switch circuit is coupled between the power supply terminal and the level shift circuit.

In one embodiment of the RF communications system, the level shift circuit comprises at least one diode and a resistor, wherein the at least one diode and the resistor are coupled in series.

In one embodiment of the RF communications system, the at least one diode is a P-N junction diode, a Schottky diode, or a Zener diode.

In one embodiment of the RF communications system, the level shift circuit further includes at least one capacitor coupled between the at least one diode and ground.

In one embodiment of the RF communications system, the switch circuit includes a switch transistor. When the switch transistor is closed, the switch circuit is closed, and when the switch transistor is open, the switch circuit is open.

In one embodiment of the RF communications system, the switch transistor is a BJT or a FET.

In one embodiment of the RF communications system, the interface circuit includes a current mirror structure coupled to the bias circuit.

In one embodiment of the RF communications system, the bias circuit comprises a reference voltage supply providing a reference voltage and a number of bias transistors. Herein, the reference voltage supply is coupled to the switch circuit.

In one embodiment of the RF communications system, one of the bias transistors and the at least one PA transistor form a current mirror structure.

In one embodiment of the RF communications system, when the RF PA is in the operation mode, the reference voltage exceeds a switch threshold. When the RF PA is in the standby mode, the reference voltage is below the switch threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

It will be understood that for clear illustrations, FIGS. 1-6C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
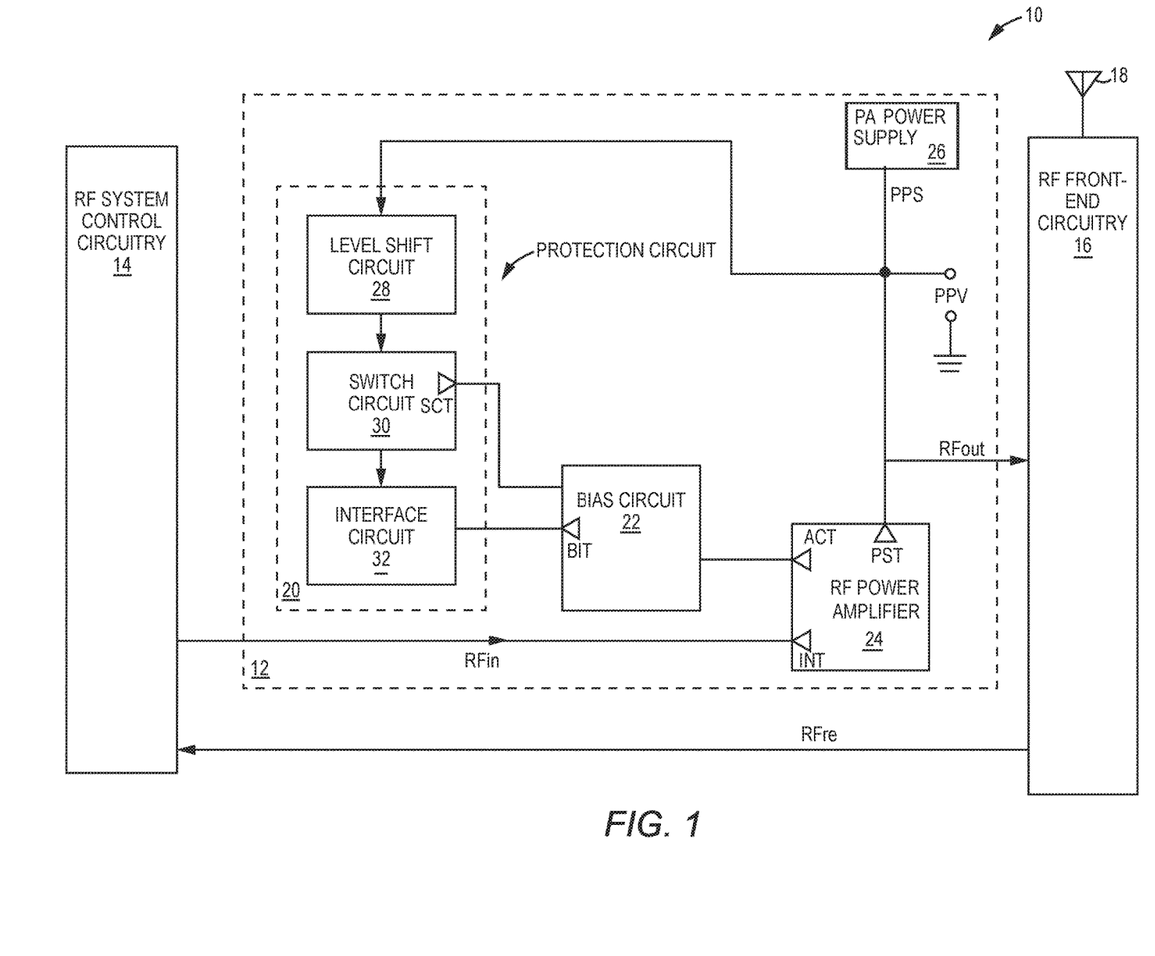
FIG. 1 shows an exemplary RF communications system according to one embodiment of the present disclosure.

The present disclosure relates to a radio frequency (RF) communications system having an RF power amplifier (PA) and a low leakage protection circuit for the RF PA. FIG. 1 shows an exemplary RF communications system 10 according to one embodiment of the present disclosure. The RF communications system 10 includes an RF transmitter circuitry 12, an RF system control circuitry 14, an RF front-end circuitry 16, and an RF antenna 18. Herein, during a receive procedure, the RF front-end circuitry 16 receives (via the RF antenna 18), processes, and forwards an RF receive signal RFre to the RF system control circuitry 14. During a transmit procedure, an RF input signal RFin is provided to the RF transmitter circuitry 12 from a baseband circuitry (not shown) in the RF system control circuitry 14. The RF transmitter circuitry 12 receives and amplifies the RF input signal RFin and provides an RF output signal RFout to the RF front-end circuitry 16. The RF front-end circuitry 16 receives, processes, and transmits the RF output signal RFout via the RF antenna 18.

In detail, the RF transmitter circuitry 12 includes a protection circuit 20, a bias circuit 22, an RF PA 24, and a PA power supply 26. The RF PA 24 has a power supply terminal PST, an RF input terminal INT, and an amplifier control terminal ACT. The PA power supply 26 is coupled to the power supply terminal PST, the bias circuit 22 is coupled to the amplifier control terminal ACT, the RF system control circuitry 14 is coupled to the RF input terminal INT, and the protection circuit 20 is coupled between the power supply terminal PST and the bias circuit 22. Herein, the PA power supply 26 provides power to the RF PA 24 and the protection circuit 20 using a PA power supply signal PPS. The PA power supply signal PPS has a PA power supply voltage PPV. In some applications, the PA power supply signal PPS may be modulated by a power control signal (not shown) from the RF control circuitry 14. The RF PA 24 is configured to receive the RF input signal RFin via the RF input terminal INT and provide the RF output signal RFout via the power supply terminal PST.

In one embodiment, when the RF PA 24 is in an operation mode and a magnitude of a voltage at the power supply terminal PST does not exceed a protection threshold, the bias circuit 22 is configured to bias the RF PA 24 via the amplifier control terminal ACT. When the RF PA 24 is in an operation mode and the magnitude of the voltage at the power supply terminal PST exceeds the protection threshold, the protection circuit 20 is configured to reduce a current through the power supply terminal PST using the bias circuit 22 via the amplifier control terminal ACT. Further, when the RF PA is in a standby mode (regardless of the magnitude of the voltage at the power supply terminal PST), the protection circuit 20 is configured to be open and does not allow a current to pass through. Herein, the operation mode of the RF PA 24 refers to a first mode, in which the RF PA 24 amplifies the RF input signal RFin properly and provides the RF output signal RFout at the power supply terminal PST. The standby mode of the RF PA 24 refers to a second mode, in which the RF PA 24 does not amplify the RF input signal RFin and does not provide the RF output signal RFout at the power supply terminal PST. Without the protection circuit 20, a magnitude increase of the voltage at the power supply terminal PST may lead to a significant current increase through the power supply terminal PST. The increase of both voltage and current may cause heating of the RF PA 24, which may damage or degrade the RF PA 24. As such, the protection circuit 20 reduces the current through the power supply terminal PST when the magnitude of the voltage at the power supply terminal PST exceeds the protection threshold, thereby reducing or preventing damage to the RF PA 24.

In one embodiment of the protection circuit 20, the protection circuit 20 includes a level shift circuit 28, a switch circuit 30, and an interface circuit 32. The level shift circuit 28, the switch circuit 30, and the interface circuit 32 are coupled in series. The level shift circuit 28 is coupled between the power supply terminal PST and the interface circuit 32, and the interface circuit 32 is coupled between the level shift circuit 28 and a bias interface terminal BIT of the bias circuit 22. The switch circuit 30 may be coupled between the level shift circuit 28 and the interface circuit 32, or between the power supply terminal PST and the level shift circuit 28 (not shown). The switch circuit 30 is controlled at a switch control terminal SCT to open or close the protection circuit 20. When the RF PA 24 is in the operation mode, the switch circuit 30 is configured to close the protection circuit 20. When the RF PA 24 is in the standby mode, the switch circuit 30 is configured to open the protection circuit 20. As such, when the RF PA 24 is in the standby mode, no matter how the PA power supply 26 changes, the protection circuit 20 does not operate and does not allow a current to pass through.

Figure 2A:
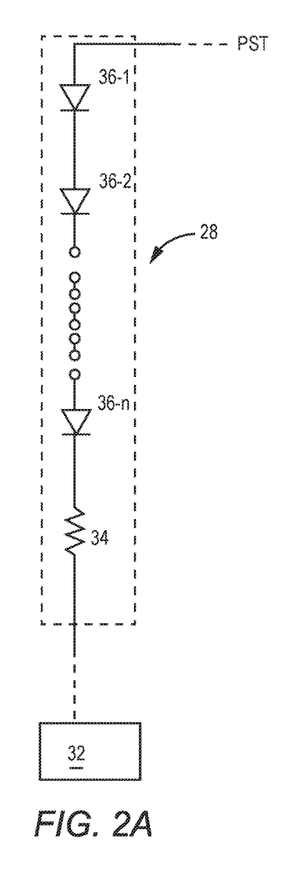
FIGS. 2A-2G show details of a level shift circuit of the RF communications system illustrated in FIG. 1.
Figure 2B:
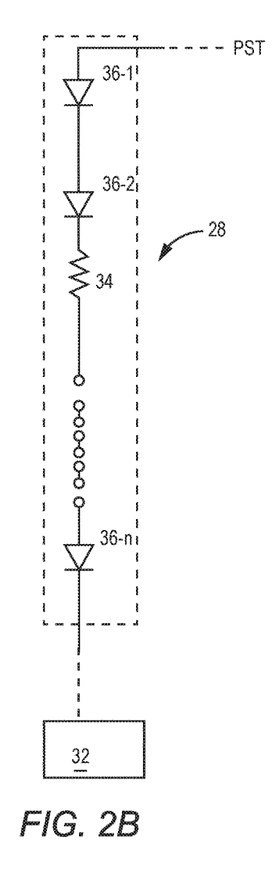
Figure 2C:
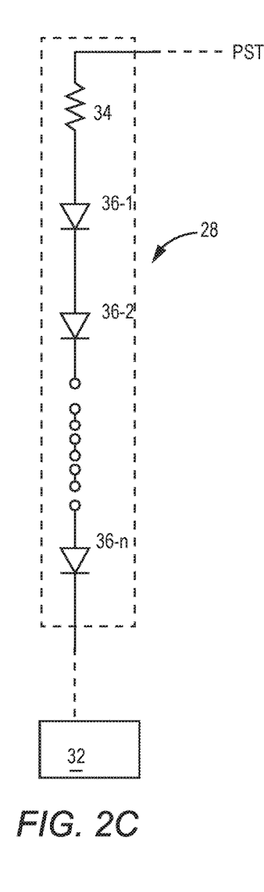

FIGS. 2A-2G show details of the level shift circuit 28 of the RF communications system 10 illustrated in FIG. 1. The level shift circuit 28 includes a resistor 34 and at least one diode 36. The protection threshold is determined by a turn-on voltage of the at least one diode 36 in the level shift circuit 28. The resistor 34 may be placed in series between the interface circuit 32 and a group of diodes 36-1~36-n (FIG. 2A), may be placed in series within the group of diodes 36-1~36-n (FIG. 2B), or may be placed in series between the power supply terminal PST and the group of diodes 36-1~36-n (FIG. 2C). Herein, the group of diodes 36-1~36-n are coupled in series. The group of diodes 36-1~36-n may be P-N junction diodes or Schottky diodes and fabricated by Silicon, Gallium arsenide, or Gallium nitride semiconductor technology. In different applications, the level shift circuit 28 may include fewer or more diodes, and may include multiple resistors or no resistors.

Figure 2D:
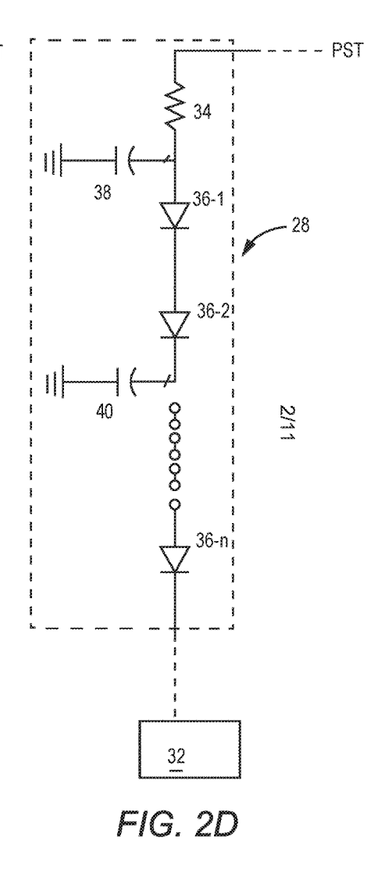
Figure 2E:
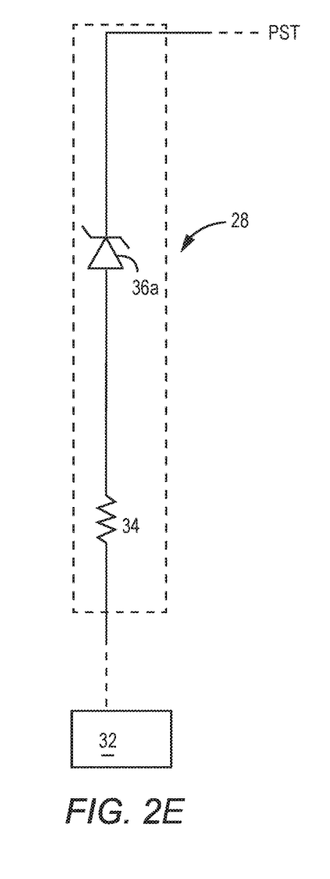
Figure 2F:
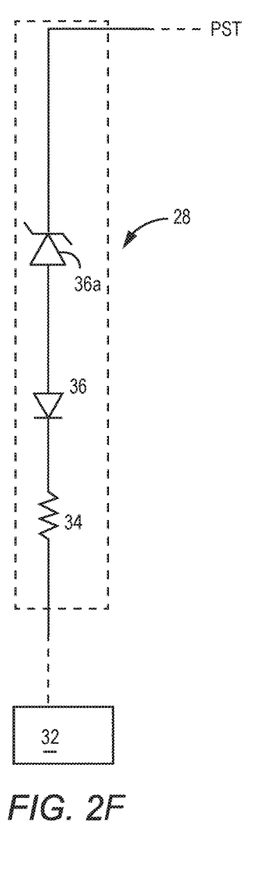
Figure 2G:
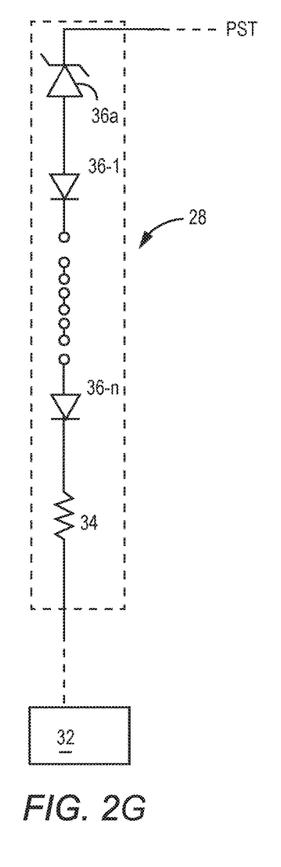

In addition, as shown in FIG. 2D, the level shift circuit 28 may further include a first capacitor 38 and a second capacitor 40 to control loop gain and improve stability of the protection circuit 20. Herein, the first capacitor 38 is coupled between the first diode 36-1 and ground, and the second capacitor 40 is coupled between the second diode 36-2 and ground. In different applications, the level shift circuit 28 may include fewer or more capacitors, and each capacitor may be coupled between a different diode and ground. It is clear that when the magnitude of the voltage at the power supply terminal PST does not exceed the protection threshold, the group of diodes 36-1~36-n will not be conducted and therefore the level shift circuit 28 and the protection circuit 20 do not operate. When the magnitude of the voltage at the power supply terminal PST is high enough (exceeding the protection threshold), the group of diodes 36-1~36-n may be conducted and therefore the level shift circuit 28 and the protection circuit 20 may operate. Herein, the protection threshold may be designed to be equal to or larger (like about 0.5V higher) than an operating voltage of the protection circuit 20 (the operation voltage of the protection circuit 20 is a voltage at which the protection circuit 20 is operated), In another embodiment, the level shift circuit 28 includes the resistor 34 and only one Zener diode 36a as illustrated in FIG. 2E. The resistor 34 may be placed in series between the interface circuit 32 and the Zener diode 36a. Further, there may be one or more P-N junction diodes/Schottky diodes 36-1~36-n coupled in series between the resistor 34 and the Zener diode 36a as shown in FIGS. 2F and 2G.

Figure 3A:
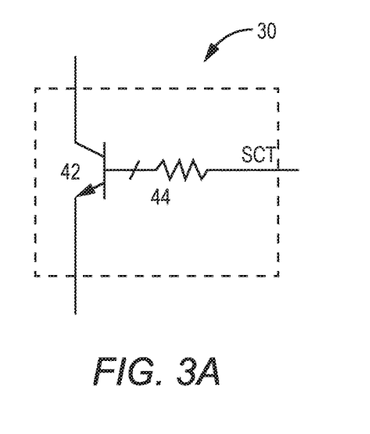
FIGS. 3A-3B show details of a switch circuit of the RF communications system illustrated in FIG. 1.
Figure 3B:
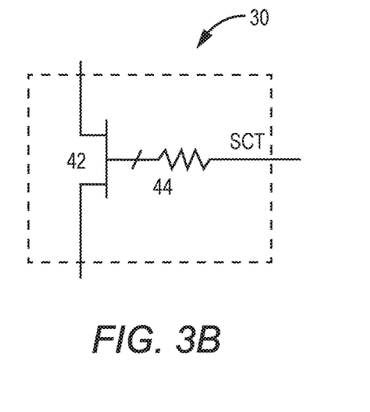

FIGS. 3A-3B show details of the switch circuit 30 of the RF communications system 10 illustrated in FIG. 1. The switch circuit 30 may include a switch transistor 42 and a switch resistor 44. The switch transistor 42 may be a bipolar junction transistor (BJT) or a field effect transistor (FET). When the switch transistor 42 is a BJT (NPN BJT or PNP BJT), the switch resistor 44 is coupled between a base of the switch transistor 42 and the switch control terminal SCT. A collector or an emitter of the switch transistor 42 is coupled to the level shift circuit 28 (not shown). When the switch transistor 42 is a FET (NFET or PFET), the switch resistor 44 is coupled between a gate of the switch transistor 42 and the switch control terminal SCT. A drain or a source of the switch transistor 42 is coupled to the level shift circuit 28 (not shown). In order to have the switch transistor 42 closed, the level shift circuit 28 needs to be conducted and the switch control terminal SCT needs to be biased over a switch threshold. In other words, when the switch transistor 42 is closed, the magnitude of the voltage at the power supply terminal PST exceeds the protection threshold and the switch control terminal SCT is biased over the switch threshold. If the magnitude of the voltage at the power supply terminal PST does not exceed the protection threshold or the switch control terminal SCT is biased below the switch threshold, the switch circuit 30 is open and the protection circuit 20 does not allow a current to pass through.

Figure 4A:
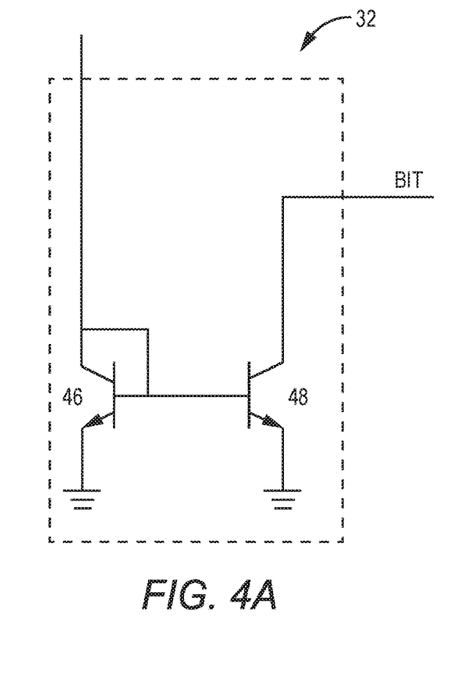
FIGS. 4A-4C show details of an interface circuit of the RF communications system illustrated in FIG. 1.
Figure 4B:
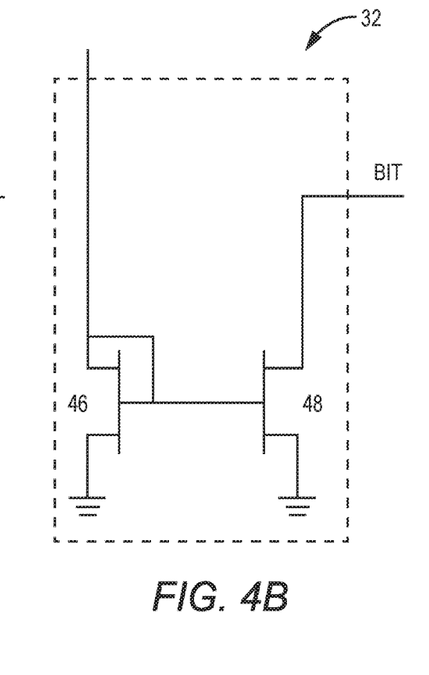
Figure 4C:
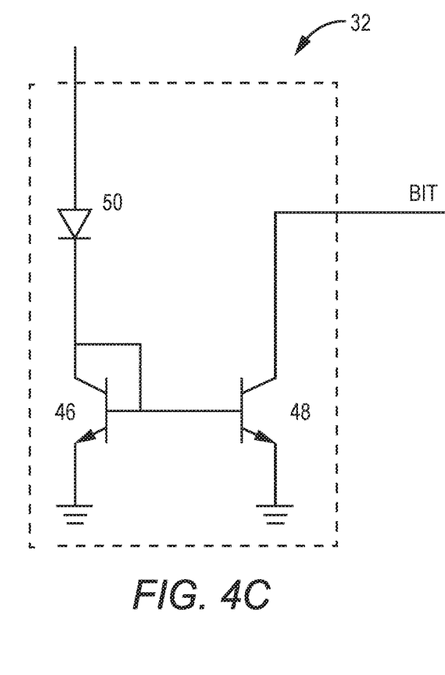

FIGS. 4A-4C show details of the interface circuit 32 of the RF communications system 10 illustrated in FIG. 1. The interface circuit 32 includes a first interface transistor 46 and a second interface transistor 48 to form a current mirror structure coupled to the bias interface terminal BIT of the bias circuit 22. In different applications, the first interface transistor 46 and the second interface transistor 48 may be BJTs or FETs. If the RF communications system 10 is implemented by a bipolar process, the switch transistor 42 in the switch circuit 30, the first interface transistor 46, and the second interface transistor 48 are BJTs. If the RF communications system 10 is implemented by a BiFET or BiCMOS technology, the switch transistor 42 in the switch circuit 30 may be a FET, while the first interface transistor 46 and the second interface transistor 48 are BJTs. If the RF communications system 10 is implemented by a CMOS process, the switch transistor 42 in the switch circuit 30, the first interface transistor 46, and the second interface transistor 48 are FETs.

Herein, when the first interface transistor 46 and the second interface transistor 48 are BJTs, a base of the second interface transistor 48 is coupled to a base and a collector of the first interface transistor 46, such that a current in the second interface transistor 48 mirrors a current in the first interface transistor 46 (as shown in FIG. 4A). When the first interface transistor 46 and the second interface transistor 48 are FETs, a gate of the second interface transistor 48 is coupled to a gate and a drain of the first interface transistor 46, such that the current in the second interface transistor 48 mirrors the current in the first interface transistor 46 (as shown in FIG. 4B).

Notice that the switch threshold may be equal to or larger than the sum of the turn-on voltages for the switch transistor 42 and the first interface transistor 46. When the magnitude of the voltage at the power supply terminal PST exceeds the protection threshold and the switch control terminal SCT is biased over the switch threshold, the current mirror formed by the first interface transistor 46 and the second interface transistor 48 may shunt a current from the bias circuit 22 via the bias interface terminal BIT, and thereby reduce the current through the RF PA 24 and protect the RF PA 24 (more details are described in the following paragraphs). In addition, as shown in FIG. 4C, the interface circuit 32 may further include at least one extra diode 50 to further shift the turn-on voltage level at the switch control terminal SCT. The at least one extra diode 50 is coupled to the collector/drain of the first interface transistor 46. Herein, the switch threshold may be equal to or larger than the sum of the turn-on voltages for the switch transistor 42, the at least one extra diode 50, and the first interface transistor 46.

Figure 5A:
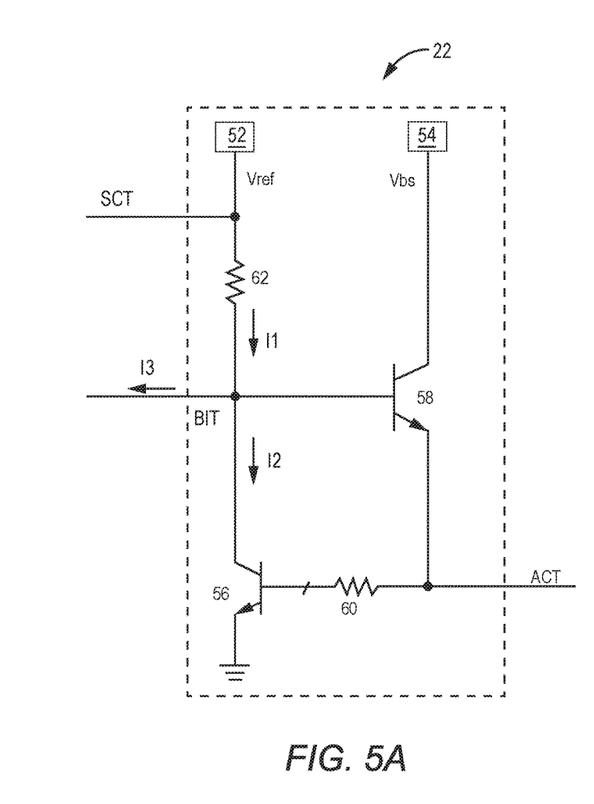
FIGS. 5A-5H show details of a bias circuit of the RF communications system illustrated in FIG. 1.

FIGS. 5A-5H show details of the bias circuit 22 of the RF communications system 10 illustrated in FIG. 1. As shown in FIG. 5A, the bias circuit 22 includes a reference voltage supply 52, a bias power supply 54, a first bias transistor 56, a second bias transistor 58, a first bias resistor 60, and a second bias resistor 62. The reference voltage supply 52 is coupled to the switch control terminal SCT of the switch circuit 30 and provides a reference voltage Vref, such that the reference voltage Vref controls the switch circuit 30 to be open or closed. When the switch circuit 30 is configured to be closed, the reference voltage Vref must exceed the switch threshold, and when the switch circuit 30 is configured to be open, the reference voltage Vref1 may be below the switch threshold.

In this embodiment, the first bias transistor 56 and the second bias transistor 58 are BJT transistors. The first bias resistor 60 is coupled between the amplifier control terminal ACT of the RF PA 24 and a base of the first bias transistor 56. An emitter of the first bias transistor 56 is coupled to ground, and a collector of the first bias transistor 56 is coupled to the reference voltage supply 52 via the second bias resistor 62, a base of the second bias transistor 58, and the interface circuit 32 via the bias interface terminal BIT. An emitter of the second bias transistor 58 is coupled to the amplifier control terminal ACT. A collector of the second bias transistor 58 receives a bias supply voltage Vbs from the bias power supply 54. The bias power supply 54 may be a battery and the bias supply voltage Vbs is constant.

When the magnitude of the voltage at the power supply terminal PST is below the protection threshold and the reference voltage supply 52 meets operation requirements, the bias circuit 22 will provide a normal operating bias to the RF PA 24 via the amplifier control terminal ACT. Herein, when the reference voltage supply 52 meets the operation requirements of the bias circuit 22, the reference voltage Vref may exceed the switch threshold. However, since the magnitude of the voltage at the power supply terminal PST is below the protection threshold, the level shift circuit 28 of the protection circuit 20 will not be conducted and the protection circuit 20 will not change operation of the bias circuit 22 (I2=I1). When the magnitude of the voltage at the power supply terminal PST exceeds the protection threshold and the reference voltage supply 52 meets operation requirements, the protection circuit 20 will shunt a current (I3) away from the first bias transistor 56 (I2=I1−I3), which will reduce the bias to the RF PA 24 via the amplifier control terminal ACT, thereby protecting the RF PA 24. Further, when the reference voltage supply 52 does not meet the operation requirements (generally the reference voltage Vref equals to zero), the bias circuit 22 will not operate and will not provide a bias to the RF PA 24. In addition, since the reference voltage Vref is low, the switch control terminal SCT of the switch circuit 30 may not be biased over the switch threshold and the switch circuit 30 is open. Consequently, there is essentially no current passing through the protection circuit 20. It is clear to those skilled in the art, whether the magnitude of the voltage at the power supply terminal PST exceeds the protection threshold or not, if the reference voltage Vref is low (below the switch threshold), the switch circuit 30 is always open and the protection circuit 20 does not allow a current to pass through.

Figure 5B:
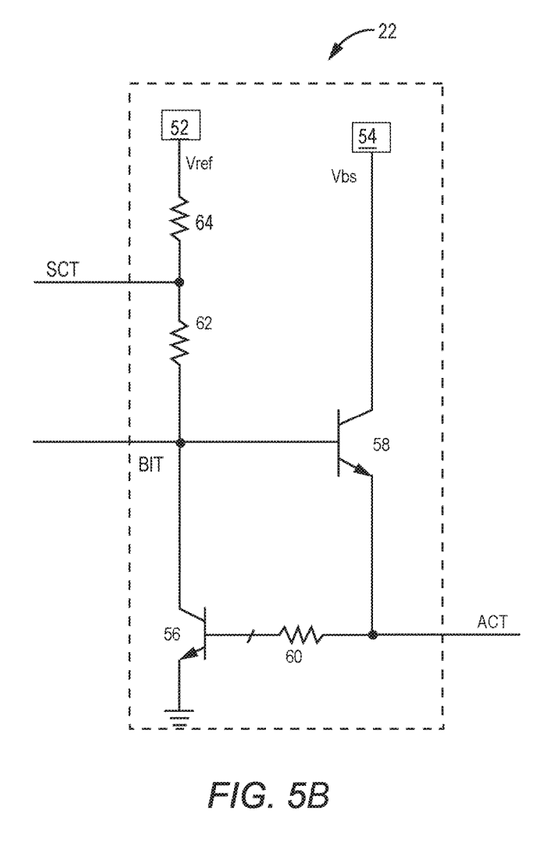

FIG. 5B shows a more generalized version of FIG. 5A. In this embodiment, the bias circuit 22 may further include a third bias resistor 64 coupled in series between the second bias resistor 62 and the reference voltage supply 52. The second bias resistor 62 and the third bias resistor 64 form a voltage divider network. The switch control terminal SCT of the switch circuit 30 is directly coupled to a joint point of the second bias resistor 62 and the third bias resistor 64. The second bias resistor 62 and the third bias resistor 64 may vary in value, with one or the other being zero in the limit.

Figure 5C:
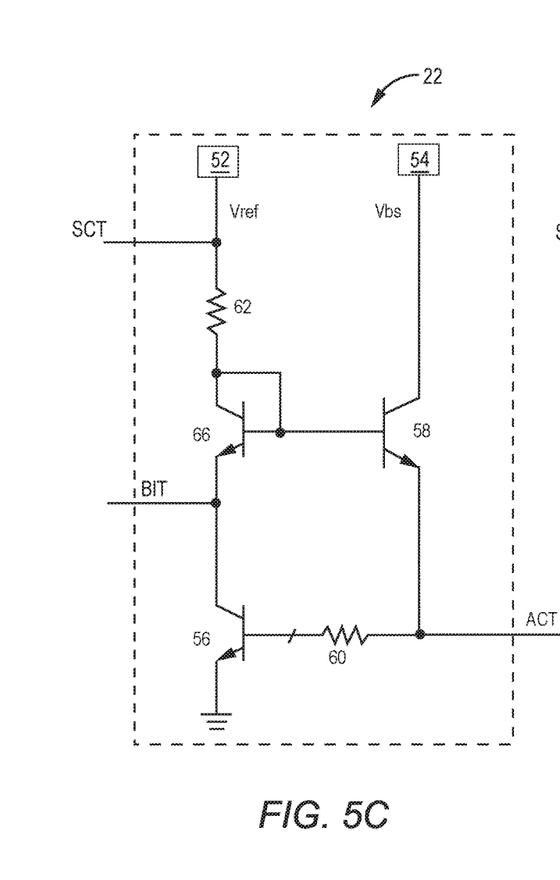
Figure 5D:
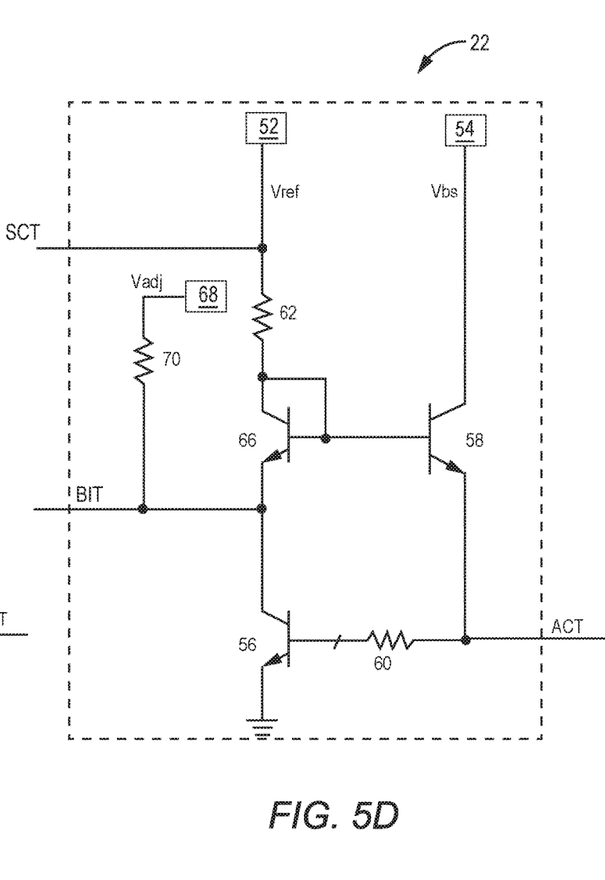
Figure 5E:
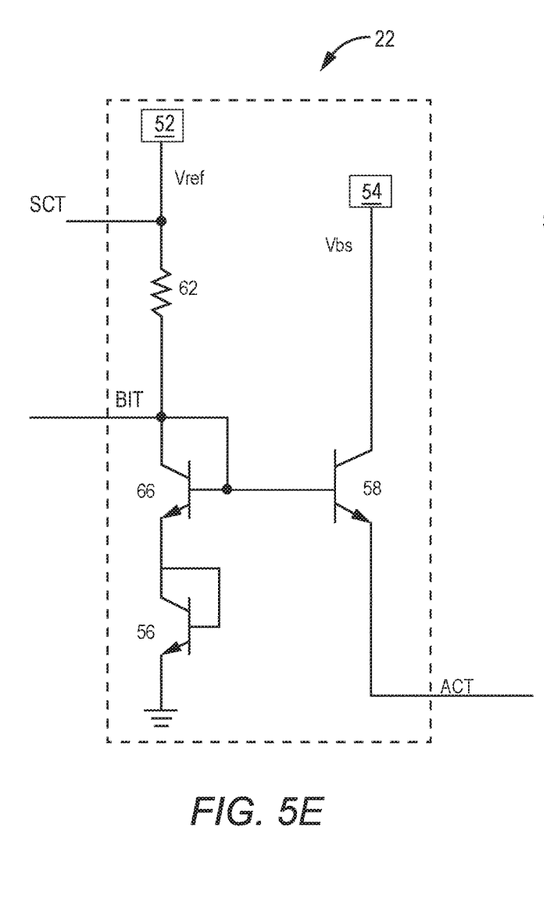

In one embodiment, the bias circuit 22 may further include a third bias transistor 66 as shown in FIG. 5C. The collector of the first bias transistor 56 is coupled to the reference voltage supply 52 via the third bias transistor 66 and the second bias resistor 62, coupled to the base of the second bias transistor 58 via the third bias transistor 66, and coupled to the interface circuit 32 via the bias interface terminal BIT. An emitter of the third bias transistor 66 is coupled to the collector of the first bias transistor 56, a base and a collector of the third bias transistor 66 are coupled together and further coupled to the base of the second bias transistor 58. In another embodiment, the bias circuit 22 may further include an extra adjustment voltage supply 68 providing an adjustment voltage Vadj to the bias interface terminal BIT through a fourth bias resistor 70, as shown in FIG. 5D. The extra adjustment voltage supply 68 is used to adjust a bias current through the first bias transistor 56. In another embodiment, the first bias resistor 60 is omitted in the bias circuit 22, as shown in FIG. 5E. In addition, the base and the collector of the first bias transistor 56 are coupled together. The bias interface terminal BIT, which is coupled to the interface circuit 32 is placed at a joint point between the collector (base) of the third bias transistor 66 and the second bias resistor 62.

Figure 5F:
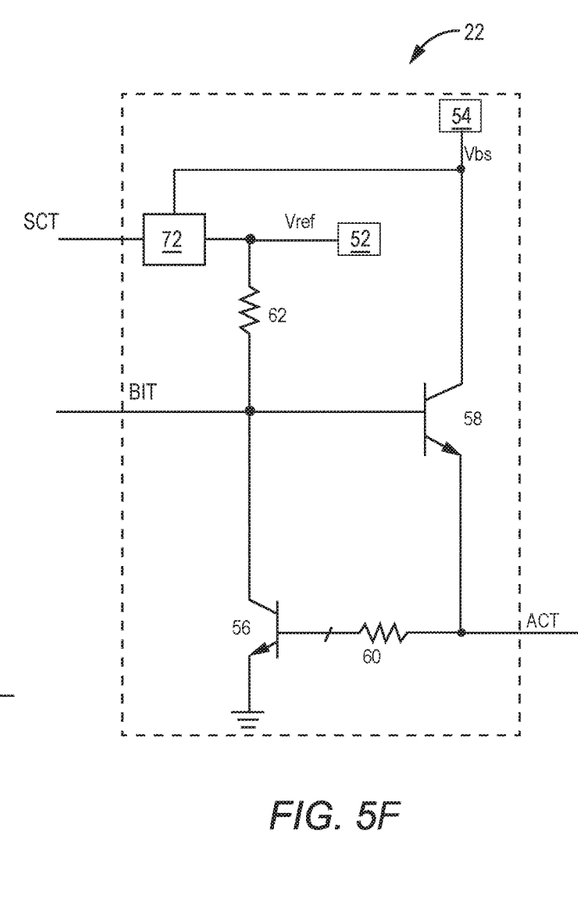

As illustrated in FIGS. 5A-5E, the reference voltage supply 52 is utilized to control the switch circuit 30 via the switch control terminal SCT. In some applications, an additional switch control circuit 72 may be utilized to control the switch circuit 30 via the switch control terminal SCT as shown in FIG. 5F. The switch control circuit 72 is placed before the switch control terminal SCT of the switch circuit 30. The switch control circuit 72 may be supplied by the bias circuit supply Vbs, and the switch control terminal SCT may be controlled by a combination of the reference voltage Vref and other external signals (not shown) from the RF system control circuitry 14. The switch control circuit 72 is configured to determine when to set the switch control terminal SCT above or below the switch threshold based on the values applied to the switch control circuit 72.

Figure 5G:
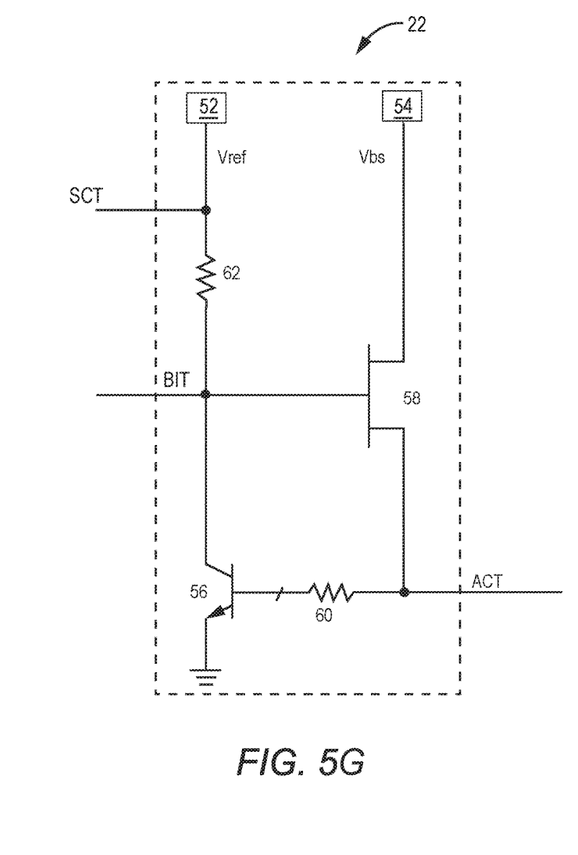
Figure 5H:
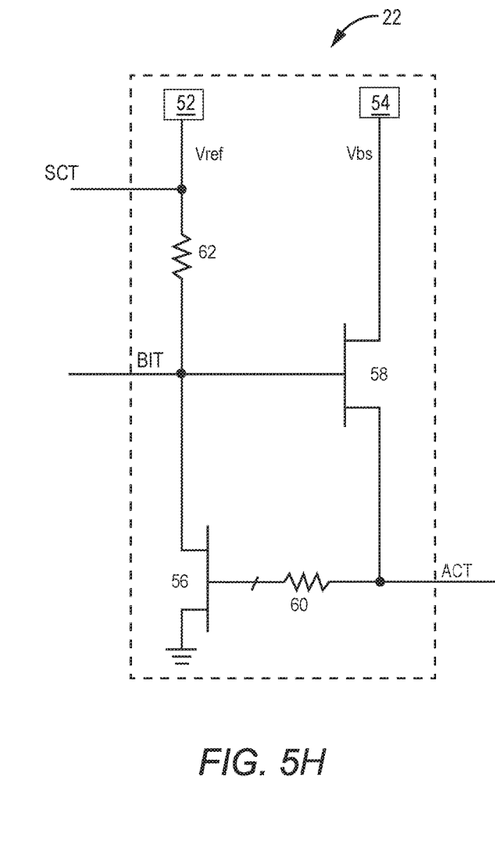

In different applications, the first bias transistor 56 and the second bias transistor 58 may both be FETs or may be mixed transistors, as shown in FIG. 5G and FIG. 5H. If the RF communications system 10 is implemented by a bipolar process, the first bias transistor 56 and the second bias transistor 58 are BJTs. If the RF communications system 10 is implemented by a BiFET or BiCMOS technology, the first bias transistor 56 may be a BJT, while the second bias transistor 58 may be a FET. If the RF communications system 10 is implemented by a CMOS process, the first bias transistor 56 and the second bias transistor 58 are FETs.

Notice that, for any embodiment illustrated in FIGS. 5A-5H, when the bias circuit 22 is conducted and configured to bias the RF PA 24 via the amplifier control terminal ACT, the reference voltage supply 52 must meet operation requirements. If the reference voltage supply 52 does not meet operation requirements (for example, the reference voltage Vref is equal to zero), the bias circuit 22 is open and will not bias the RF PA 24. As such, the reference voltage supply 52 must meet operation requirements (the reference voltage Vref exceeds the switch threshold) to ensure the RF PA 24 in the operation mode. Conversely, in the standby mode of the RF PA 24, the reference voltage supply 52 does not meet operation requirements (the reference voltage Vref is below the switch threshold).

Figure 6A:
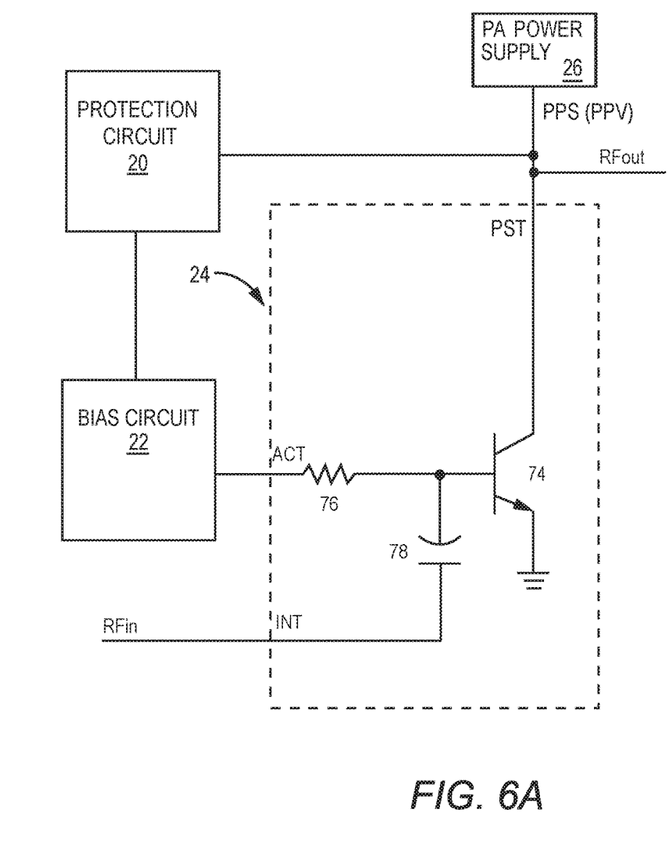
FIGS. 6A-6C shows details of a RF power amplifier of the RF communications system illustrated in FIG. 1.
Figure 6B:
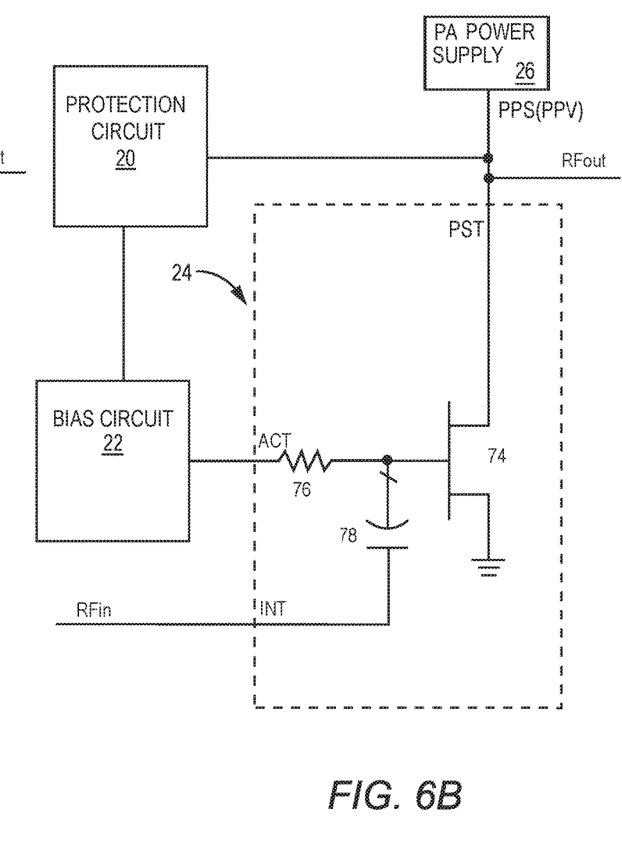
Figure 6C:
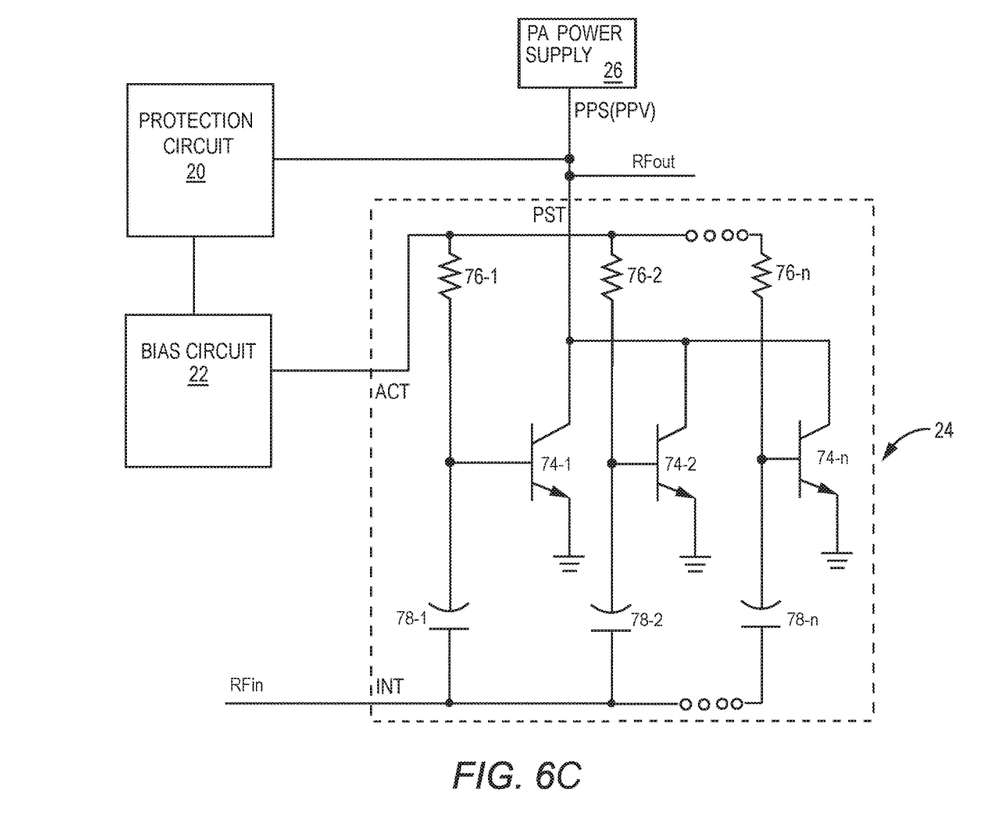

FIGS. 6A-6C show details of the RF PA 24 of the RF communications system 10 illustrated in FIG. 1. The RF PA 24 includes a PA transistor 74, a ballast resistor 76, and an input capacitor 78. The PA transistor 74 is configured to receive the RF input signal RFin via the RF input terminal INT through the input capacitor 78 and provide the RF output signal RFout via the power supply terminal PST. The input capacitor 78 provides capacitive coupling between the RF system control circuitry 14 and the PA transistor 74. The ballast resistor 76 is coupled between the amplifier control terminal ACT and the PA transistor 74 to control thermal stability of the PA transistor 74.

The PA transistor 74 may be a BJT (NPN BJT or PNP BJT) or FET (NFET or PFET). The transistor type of the PA transistor 74 may be the same or different as the transistor type of the first bias transistor 56 in the bias circuit 22. When the PA transistor 74 is a BJT (shown in FIG. 6A), the ballast resistor 76 is coupled between a base of the PA transistor 74 and the amplifier control terminal ACT. A collector of the PA transistor 74 is the power supply terminal PST and an emitter of the PA transistor 74 is coupled to ground. The RF input signal RFin is applied to the base of the PA transistor 74 through the input capacitor 78, and the PA power supply 26 provides power for amplification of the PA transistor 74 via the collector of the PA transistor 74. When the PA transistor 74 is a FET (shown in FIG. 6B), the ballast resistor 76 is coupled between a gate of the PA transistor 74 and the amplifier control terminal ACT. A drain of the PA transistor 74 is the power supply terminal PST and a source of the PA transistor 74 is coupled to ground. The RF input signal RFin is applied to the gate of the PA transistor 74 through the input capacitor 78, and the PA power supply 26 provides power for the amplification of the PA transistor 74 via the drain of the PA transistor 74.

The bias circuit 22 is coupled to the amplifier control terminal ACT of the RF PA 24, where the first bias transistor 56 or the third bias transistor 66 in the bias circuit 22 and the PA transistor 74 form a current mirror structure. Therefore, when a current through the first bias transistor 56 or the third bias transistor 66 of the bias circuit 22 reduces, a current though the PA transistor 74 will reduce. As described above, when the protection circuit 20 detects the magnitude of a voltage at the power supply terminal PST exceeding the protection threshold and the reference voltage supply 52 in the bias circuit 22 meets operation requirements (the RF PA 24 is in the operation mode), the protection circuit 20 will shunt a current away from the first bias transistor 56 or the third bias transistor 66. Consequently, the current through the PA transistor 74, which mirrors the current through the first bias transistor 56 or the third bias transistor 66, will also reduce. Conversely, when the magnitude of the voltage at the power supply terminal PST does not exceed the protection threshold and the reference voltage supply 52 in the bias circuit 22 meets operation requirements (the RFPA 24 is in operation mode), the protection circuit 20 is not conducted and the bias circuit 22 biases the PA transistor 74 via the amplifier control terminal ACT.

Further, when the reference voltage supply 52 does not meet the operation requirements (the RF PA 24 is in the standby mode), the switch circuit 30 in the protection circuit 22 is open. As such, whether the magnitude of the voltage at the power supply terminal PST exceeds the protection threshold or not, there is essentially no current passing through the protection circuit 20. Therefore, the protection circuit 20 not only protects the RF PA 24 in extreme conditions during the operation mode of the RF PA 24, but also eliminates leakage current during the standby mode of the RF PA 24.

Notice that, the magnitude of the voltage at the power supply terminal PST exceeding the protection threshold may occur in various conditions. When the PA power supply voltage PPV exceeds a power supply voltage threshold, the magnitude of the voltage at the power supply terminal PST may exceed the protection threshold. When the magnitude of the RF input signal RFin exceeds the RF input signal threshold, the magnitude of the voltage at the power supply terminal PST may exceed the protection threshold. Further, when a magnitude of a voltage standing wave ratio (VSWR) condition at the power supply terminal PST exceeds a VSWR threshold, the magnitude of the voltage at the power supply terminal PST may exceed the protection threshold. Without the protection circuit 20, if the PA power supply voltage PPV exceeds a power supply voltage threshold, and/or if the magnitude of the RF input signal RFin exceeds the RF input signal threshold, and/or if the a magnitude of a voltage standing wave ratio (VSWR) condition at the power supply terminal PST exceeds a VSWR threshold, the current through the power supply terminal PST will also increase. The increase of the voltage at the power supply terminal PST and the increase of the current through the PA transistor 74 causes heating of the RF PA 24, which may damage or degrade the RF PA 24. The protection circuit 20 reduces the current through the power supply terminal PST using the bias circuit 22, thereby reducing or preventing damage to the RF PA 24.

In another embodiment, the RF PA 24 includes a number of PA transistors 74-1~74-n, a number of ballast resistors 76-1~76-n, and a number of input capacitors 78-1~78-n, as shown in FIG. 6C. This group of PA transistors 74-1~74-n are coupled in parallel. A collector of each PA transistor 74 is coupled to the power supply terminal PST and an emitter of each PA transistor 74 is coupled to ground. A base/gate of each PA transistor 74 is coupled to the bias circuit 22 through a corresponding ballast resistor 76 and receives the RF input signal RFin through a corresponding input capacitor 78.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) communications system comprising:
   an RF power amplifier (PA) having an amplifier control terminal, a power supply terminal, and an RF input terminal;
   a bias circuit coupled to the amplifier control terminal; and
   a protection circuit comprising a level shift circuit, an interface circuit, and a switch circuit, wherein:
      the level shift circuit is coupled between the power supply terminal and the interface circuit, the interface circuit is coupled between the bias circuit and the level shift circuit, and the switch circuit is coupled in series with the level shift circuit and the interface circuit;
      when the RF PA is in an operation mode and a magnitude of a voltage at the power supply terminal exceeds a protection threshold, the protection circuit is closed and configured to reduce a current through the power supply terminal using the bias circuit via the amplifier control terminal; and
      when the RF PA is in a standby mode, the switch circuit is configured to open the protection circuit, such that the protection circuit does not allow a current to pass through.

2. The RF communications system of claim 1 wherein the bias circuit is configured to bias the RF PA via the amplifier control terminal when the RF PA is in the operation mode and the magnitude of the voltage at the power supply terminal does not exceed the protection threshold.

3. The RF communications system of claim 1 wherein the RF PA is configured to receive an RF input signal via the RF input terminal and provide an RF output signal via the power supply terminal.

4. The RF communications system of claim 3 wherein the RF PA comprises at least one PA transistor, at least one ballast resistor, and at least one input capacitor, wherein the at least one ballast resistor is coupled between the at least one PA transistor and the amplifier control terminal, and the at least one input capacitor is coupled between the at least one PA transistor and the RF input terminal.

5. The RF communications system of claim 4 wherein the at least one PA transistor is a bipolar junction transistor (BJT) or a field-effect transistor (FET).

6. The RF communications system of claim 4 wherein the RF PA comprises a plurality of PA transistors coupled in parallel, such that the plurality of PA transistors comprises the at least one PA transistor.

7. The RF communications system of claim 4 wherein the RF PA is configured to amplify the RF input signal using a power supply signal having a power supply voltage, such that when the power supply voltage exceeds a power supply voltage threshold, the magnitude of the voltage at the power supply terminal exceeds the protection threshold.

8. The RF communications system of claim 4 wherein when a magnitude of the RF input signal exceeds an RF input signal threshold, the magnitude of the voltage at the power supply terminal exceeds the protection threshold.

9. The RF communications system of claim 4 wherein when a magnitude of a voltage standing wave ratio (VSWR) at the power supply terminal exceeds a VSWR threshold, the magnitude of the voltage at the power supply terminal exceeds the protection threshold.

10. The RF communications system of claim 1 wherein the switch circuit is coupled between the level shift circuit and the interface circuit.

11. The RF communications system of claim 1 wherein the switch circuit is coupled between the power supply terminal and the level shift circuit.

12. The RF communications system of claim 1 wherein the level shift circuit comprises at least one diode and a resistor, wherein the at least one diode and the resistor are coupled in series.

13. The RF communications system of claim 12 wherein the at least one diode is a P-N junction diode, a Schottky diode, or a Zener diode.

14. The RF communications system of claim 12 wherein the level shift circuit further comprises at least one capacitor coupled between the at least one diode and ground.

15. The RF communications system of claim 1 wherein:
   the switch circuit comprises a switch transistor;
   when the switch transistor is closed, the switch circuit is closed; and
   when the switch transistor is open, the switch circuit is open.

16. The RF communications system of claim 15 wherein the switch transistor is a BJT or a FET.

17. The RF communications system of claim 1 wherein the interface circuit comprises a current mirror structure coupled to the bias circuit.

18. The RF communications system of claim 1 wherein the bias circuit comprises a reference voltage supply providing a reference voltage and a plurality of bias transistors, wherein the reference voltage supply is coupled to the switch circuit.

19. The RF communications system of claim 18 wherein the RF PA comprises at least one PA transistor, wherein the at least one PA transistor is configured to receive and amplify an RF input signal and provide an RF output signal.

20. The RF communications system of claim 19 wherein one of the plurality of bias transistors and the at least one PA transistor form a current mirror structure.

21. The RF communications system of claim 18 wherein:
   when the RF PA is in the operation mode, the reference voltage exceeds a switch threshold; and when the RF PA is in the standby mode, the reference voltage is below the switch threshold.

* * * * *